United States Patent
Myers et al.

(10) Patent No.: US 10,360,116 B2
(45) Date of Patent: Jul. 23, 2019

(54) DISK PRESERVATION AND FAILURE PREVENTION IN A RAID ARRAY

(71) Applicant: INTERNATIONAL BUSINESS MACHINES CORPORATION, Armonk, NY (US)

(72) Inventors: Richard C. Myers, Coppell, TX (US); Randolph E. Stiarwalt, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 209 days.

(21) Appl. No.: 14/621,891

(22) Filed: Feb. 13, 2015

(65) Prior Publication Data

US 2016/0239390 A1    Aug. 18, 2016

(51) Int. Cl.
| G06F 11/20 | (2006.01) |
| G06F 11/16 | (2006.01) |
| G11C 29/00 | (2006.01) |
| G06F 11/22 | (2006.01) |
| G11C 29/04 | (2006.01) |

(52) U.S. Cl.
CPC ...... *G06F 11/1662* (2013.01); *G06F 11/2284* (2013.01); *G11C 29/765* (2013.01); *G06F 11/2094* (2013.01); *G11C 2029/0409* (2013.01)

(58) Field of Classification Search
CPC .......... G06F 11/2028; G06F 11/2041; G06F 3/0614; G06F 11/008; G06F 11/2033; G06F 1/3268; G06F 3/0653; G06F 3/0689; G06F 1/3234; G06F 11/20
See application file for complete search history.

(56) References Cited

U.S. PATENT DOCUMENTS

| 4,710,926 A * | 12/1987 | Brown ................. G06F 11/006 709/248 |
| 5,371,882 A | 12/1994 | Ludlam |
| 5,390,327 A * | 2/1995 | Lubbers .............. G06F 11/1084 714/6.32 |
| 5,566,316 A * | 10/1996 | Fechner .............. G06F 11/1662 711/114 |
| 5,586,250 A * | 12/1996 | Carbonneau .......... G06F 3/0607 714/44 |
| 6,085,333 A * | 7/2000 | DeKoning ............... G05B 9/03 714/6.32 |
| 6,148,368 A * | 11/2000 | DeKoning .......... G06F 12/0866 710/53 |
| 6,272,442 B1 * | 8/2001 | Jeffries ............... G06F 11/2221 702/108 |
| 7,107,493 B2 | 9/2006 | Nguyen et al. |

(Continued)

FOREIGN PATENT DOCUMENTS

| CN | 1776567 A | 5/2006 |
| CN | 101512493 A | 8/2009 |

*Primary Examiner* — Loan L. T. Truong
(74) *Attorney, Agent, or Firm* — Griffiths & Seaton PLLC

(57) ABSTRACT

Methods, computer systems, and computer program products for configuring a redundant array of independent disks (RAID) array by a processor device, include, within a RAID array, configuring spare failover disks to run as cold spares, such that the cold spare disks stay in a powered-down standby mode, wherein each cold spare disk is powered on individually at predetermined intervals, tested, and powered back down to standby mode.

15 Claims, 3 Drawing Sheets

(56) References Cited

U.S. PATENT DOCUMENTS

| | | | |
|---|---|---|---|
| 7,210,005 B2* | 4/2007 | Guha | G06F 1/3221 711/114 |
| 7,216,244 B2 | 5/2007 | Amano | |
| 7,468,597 B2 | 12/2008 | Jones et al. | |
| 7,472,298 B1* | 12/2008 | Kimmel | G06F 1/3203 713/320 |
| 7,505,264 B2* | 3/2009 | Hall | G11B 33/08 360/264.7 |
| 7,526,198 B1* | 4/2009 | Chiu | H04J 14/0246 398/12 |
| 7,659,697 B2 | 2/2010 | Jones et al. | |
| 8,020,053 B2 | 9/2011 | Warnes et al. | |
| 8,099,623 B1* | 1/2012 | Li | G06F 11/1084 714/6.22 |
| 8,555,110 B2 | 10/2013 | Shimose | |
| 8,806,266 B1* | 8/2014 | Qu | G06F 11/1484 714/13 |
| 2002/0097465 A1* | 7/2002 | Nobuyasu | H04J 14/0282 398/79 |
| 2003/0084357 A1* | 5/2003 | Bresniker | G06F 1/3203 713/320 |
| 2003/0084359 A1 | 5/2003 | Bresniker | G06F 1/3203 713/324 |
| 2004/0034724 A1* | 2/2004 | Bruner | G06F 3/0607 710/8 |
| 2005/0188252 A1* | 8/2005 | Amano | G06F 3/0625 714/6.3 |
| 2006/0090098 A1* | 4/2006 | Le | G06F 11/008 714/6.12 |
| 2006/0103997 A1 | 5/2006 | Jones et al. | |
| 2006/0143419 A1* | 6/2006 | Tulyani | G06F 3/061 711/165 |
| 2006/0242459 A1* | 10/2006 | Hyde, II | G11B 19/044 714/15 |
| 2007/0130341 A1* | 6/2007 | Ma | G06F 1/26 709/226 |
| 2007/0263441 A1* | 11/2007 | Cornwell | G06F 11/1068 365/185.03 |
| 2009/0265501 A1* | 10/2009 | Uehara | G06F 11/2033 710/312 |
| 2010/0275057 A1* | 10/2010 | Durica | G06F 11/2221 714/6.32 |
| 2013/0191833 A1 | 7/2013 | Kotzur et al. | |
| 2013/0232292 A1 | 9/2013 | Bandic et al. | |
| 2013/0275802 A1* | 10/2013 | Endo | G06F 11/1076 714/6.23 |
| 2014/0201577 A1* | 7/2014 | Ohtake | G06F 11/0709 714/48 |
| 2015/0074251 A1* | 3/2015 | Tameshige | G06F 11/202 709/221 |
| 2015/0120928 A1* | 4/2015 | Gummaraju | H04L 67/1008 709/226 |
| 2015/0234720 A1* | 8/2015 | Ohno | G06F 11/2007 714/11 |
| 2016/0034305 A1* | 2/2016 | Shear | G06F 9/50 707/722 |
| 2016/0050115 A1* | 2/2016 | Ganesan | H04L 12/12 709/221 |
| 2016/0105715 A1* | 4/2016 | Panje | H04N 17/004 725/14 |
| 2016/0205174 A1* | 7/2016 | Pitio | H04L 67/10 709/201 |
| 2016/0217047 A1* | 7/2016 | Ignomirello | G06F 11/1469 |
| 2019/0056875 A1* | 2/2019 | Nimura | G06F 3/0619 |

* cited by examiner

DISK PRESERVATION AND FAILURE PREVENTION IN A RAID ARRAY

BACKGROUND OF THE INVENTION

Field of the Invention

The present invention relates in general to computing systems, and more particularly, to various embodiments for disk preservation and failure prevention in a redundant array of independent disks (RAID) array.

Description of the Related Art

In today's society, computer systems are commonplace. Computer systems may be found in the workplace, at home, or at school. Computer systems may include data storage systems, or disk storage systems, to process and store data. A storage system may include one or more disk drives, which may be configured in an array, such as a Redundant Array of Independent Disks (RAID) topology. In a RAID system, data is stored redundantly across multiple disks in a variety of configurations to provide data security in the event of a hardware or software failure.

As the technology field grows exponentially each year and ever-growing amounts of critical data are stored on storage systems such as RAIDs, the need to preserve and protect such data becomes increasingly paramount. Consequently, the need for advancement in the data storage field is of great precedence.

SUMMARY OF THE DESCRIBED EMBODIMENTS

Various embodiments for configuring a redundant array of independent disks (RAID) array, by a processor device, are provided. Within a RAID array, spare failover disks are configured to run as cold spares, such that the cold spare disks stay in a powered-down standby mode. Each cold spare disk is powered on individually at predetermined intervals, tested, and powered back down to standby mode. By configuring spare failover disks as cold spares, rather than, for example, configuring them to spin as hot spares, the standby spares remain fresh with a corresponding full available lifetime of use, rather than retaining the limited lifespan of a drive in use.

In addition to the foregoing exemplary embodiment, various other embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
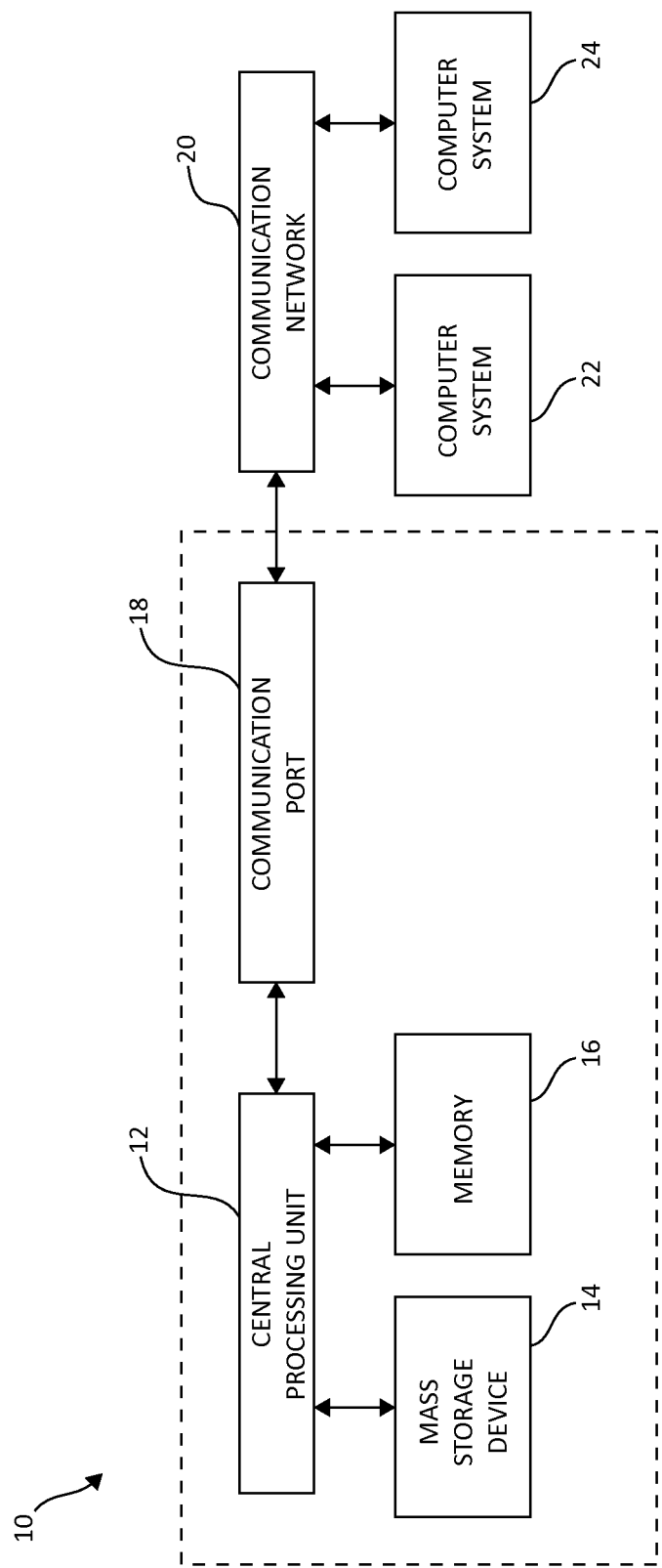
FIG. 1 illustrates a block diagram of an exemplary hardware structure for effecting management of multipath I/O, in which aspects of the present invention may be realized.

Mass storage systems continue to provide increased storage capacities to satisfy user demand. Individuals and businesses alike have come to implicitly rely on these storage systems to retain vast amounts of indispensable data. One widely used solution for data storage and preservation is the use of arrays of multiple independent disks, which may be configured to store data redundantly, or a Redundant Array of Independent Disks (RAID). The 1987 publication by David A. Patterson et al., from the University of California at Berkeley titled "*A Case for Redundant Arrays of Inexpensive Disks (RAID)*" discusses the fundamental concepts and levels of RAID technology.

A redundant array of independent disks (RAID) is a storage system that divides and replicates data among multiple hard disks. A RAID array may be configured to store data in varying ways depending upon the implementation. Different types of RAID topologies are characterized by the word RAID followed by a number, such as RAID 0, RAID 1, RAID 5, etc. In a RAID array, data is distributed across multiple disks, however the user or host sees the array as a single logical volume.

When designing a reliable system, it is recognized there will be failures within the system. In a RAID system, it is expected that at some point the storage devices, or disks operating within the array will fail. A common and widely adopted solution for disk failures in RAID arrays is the inclusion of hot spare disks. Within a RAID array, there are a number of spare disks powered up and running, for replacing an instance of a failing or failed disk in order to preserve data. These disks are known as hot spares in the art, as they are powered on and spinning continuously alongside the other disks in the array, and when a disk within the RAID array is failing, or has failed, it will failover to one of the hot spares. In other words, when a disk within the RAID array fails, a spare disk that has been continuously powered on and running alongside the other disks within the array replaces it.

During a failover, a hot spare immediately replaces the failed disk, however, the array must continue to operate without the benefit of the data on the disk until it has been rebuilt using data from other disks in the array. Since the hot spare disk replacing the failed disk has often times been powered on and operating just as long as the failed disk, many times the hot spare disk fails at the same time. RAID arrays are designed and configured to keep operating as normal when one disk failure is sustained, but simultaneous disk failures may result in actual data loss.

In view of the foregoing, the mechanisms of the illustrated embodiments provide various solutions to the previous challenges of disk preservation and failure prevention in a RAID array. These mechanisms include using a processor device to execute such functionality as configuring spare failover disks to run as cold spares, such that the cold spare disks stay in a powered-down standby mode, and powering on each cold spare disk individually at predetermined intervals, testing the disk, and powering it back down to standby mode.

The mechanisms may be applicable to a variety of network topologies and network components as will be further described. Notwithstanding the illustration of some of the functionality attendant to the various embodiments, one of ordinary skill will appreciate that the methodologies herein may be adapted to a wide variety of implementations and scenarios.

Turning now to FIG. 1, exemplary architecture 10 of a storage controller computing system environment is depicted. Architecture 10 may, in one embodiment, be implemented at least as part of a system for effecting mechanisms of the present invention. The storage controller 10 includes central processing unit (CPU) 12, which is connected to communication port 18 and memory device 16. The communication port 18 is in communication with a communication network 20. The communication network 20 and storage network may be configured to be in communication with server (hosts) 24 and storage systems, which may include storage devices 14. The storage systems may include hard disk drive (HDD) devices, solid-state devices (SSD), flash memory etc., which may be configured in a redundant array of independent disks (RAID). The communication port 18, communication network 20, and other components not pictured for the sake of brevity but known to the skilled artisan may include such hardware components as fibre channel cabling, fibre channel ports, Host-Bus Adapters (HBAs), Converged Network Adapters (CNAs), network switches and switching components, and similar communications mechanisms known to one of ordinary skill in the art. Various aspects of the illustrated embodiments may be realized using one or more of these components as will be further described.

The operations as described below may be executed on storage device(s) 14, located in system 10 or elsewhere and may have multiple memory devices 16 working independently and/or in conjunction with other CPU devices 12. Memory device 16 may include such memory as electrically erasable programmable read only memory (EEPROM) or a host of related devices. Memory device 16 and storage devices 14 are connected to CPU 12 via a signal-bearing medium. In addition, CPU 12 is connected through communication port 18 to a communication network 20, having an attached plurality of additional computer host systems 24. In addition, memory device 16 and the CPU 12 may be embedded and included in each component of the computing system 10. Each storage system may also include separate and/or distinct memory devices 16 and CPU 12 that work in conjunction or as a separate memory device 16 and/or CPU 12.

Figure 2:
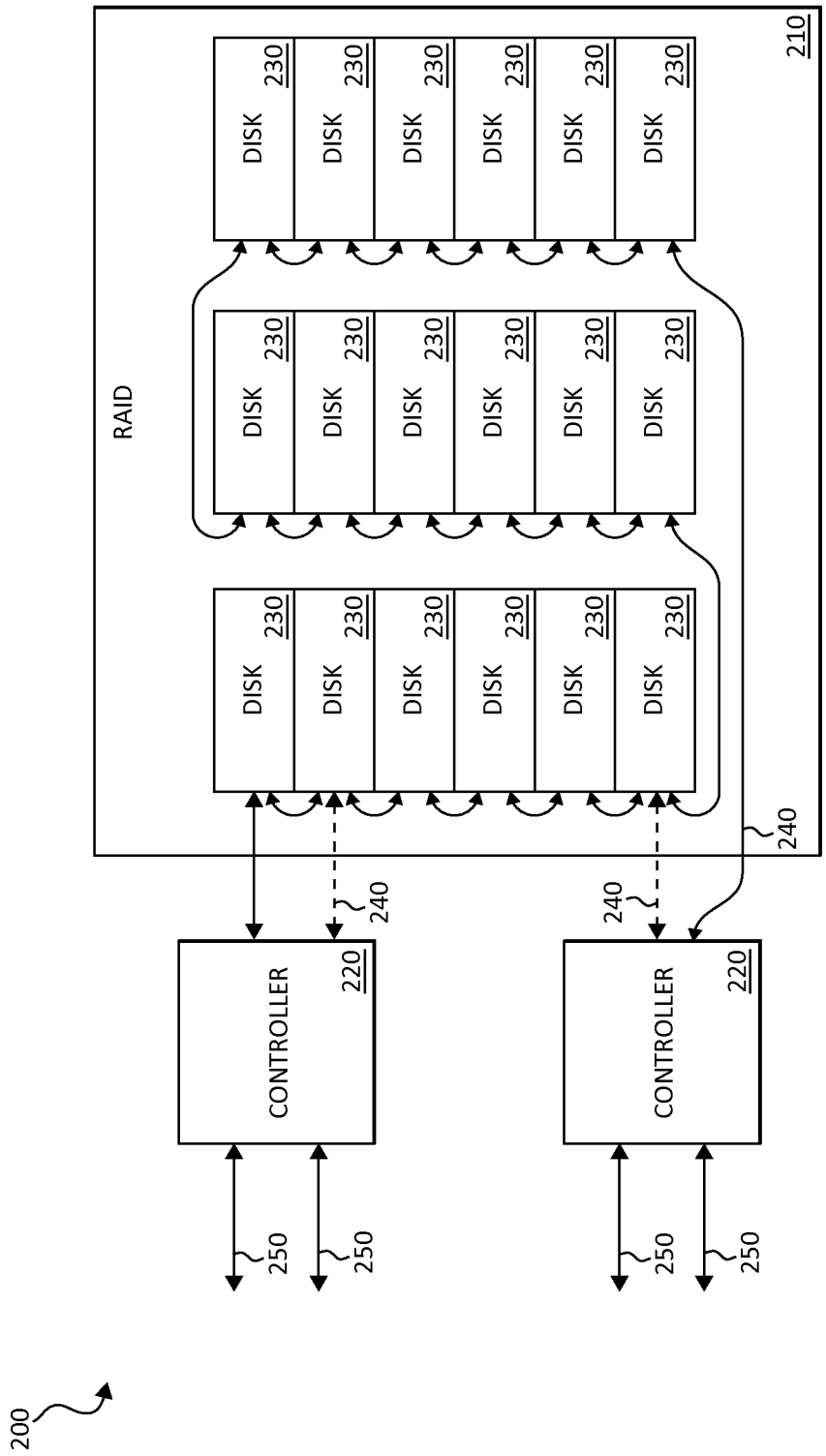
FIG. 2 illustrates an additional block diagram of an additional exemplary hardware structure, specifically portions of a RAID array, again in which aspects of the present invention may be realized.

FIG. 2 shows an example of a RAID system 200 in which one embodiment of the present invention may be affected. The RAID system 200 includes a storage array 210 and one or more RAID controllers 220. The RAID system 200 preferably includes a plurality of RAID controllers 220 in order to achieve increased reliability through redundancy. The storage array 210 is also preferably redundant by including a number of storage devices, such as hard disks 230. The storage devices 230 are interconnected with an array loop 240. The array loop 240 also interconnects the RAID controllers 220 with the storage array 210. In the depicted embodiment, the array loop 240 is a point-to-point loop such as that defined by the fibre channel standard.

In the depicted embodiment, the RAID controllers 220 each support a host connection 250. The RAID controllers 220 receive access requests via the host connection 250 and service those requests by transferring blocks of data to and from the storage array. The blocks of data that are transferred to the storage array are redundantly encoded to permit error detection and data recovery in the event of a failure of a one of the storage devices 230.

The present invention considers a technique to preserve the time to end-of-life (EOL) for spare storage devises, or disks, such as that configured in storage devices 230 of the storage array 210. As previously stated, within a RAID system, there are a number of storage devices 230, such as disks, that are spare devices. Their use is reserved to take the place of a failing or failed device within the storage array 210. Storage devices 230 that are spare devices in the array 210, have, in the past, been configured to run hot—or continuously powered up and operational. These hot spares then are directed to take upon the data load of a failing storage device 230 within the storage array 210, as RAIDs are not only able, but designed to safely retain data even in the wake of a device failure.

However, because data written to a failed storage device 230 must be rebuilt from other storage devices 230 within the storage array 210, subsequent to a device failure, the moments immediately following the failure is when the system is most vulnerable, as a simultaneous storage device 230 failure would likely result in data loss. During a failover, when attempting to replace a failing storage device 230 with a hot spare, a simultaneous storage device 230 failure is not uncommon. Often times, spare storage devices 230 operating within storage array 210 configured to run as hot spares, have been powered on and operational for some time. In many cases, hot spares have been continuously operational as long, or longer, than the disks they provide failover protection to.

The method of the present invention is to configure spare storage devices 230 in storage array 210, which otherwise would be configured to run hot-to run cold, or powered down, in a standby state. One reasoning of running spare storage devices 230 hot, is that if the devices are functioning, it is obvious they are immediately operational. This methodology may be made significantly more efficient by simply powering cold spare storage devices 230 up at predetermined times, or predetermined intervals and testing them. Following such testing, spare storage devices 230 may be powered back down to a standby state. In the case of a storage device 230 failure within the storage array 210, a cold spare storage device 230 would be powered on and provisioned to replace the failing or failed device. Since cold spare storage devices 230 are powered on and tested at predetermined times, or predetermined intervals, there may be a reasonable assumption the device will power on and function properly during a failover.

Figure 3:
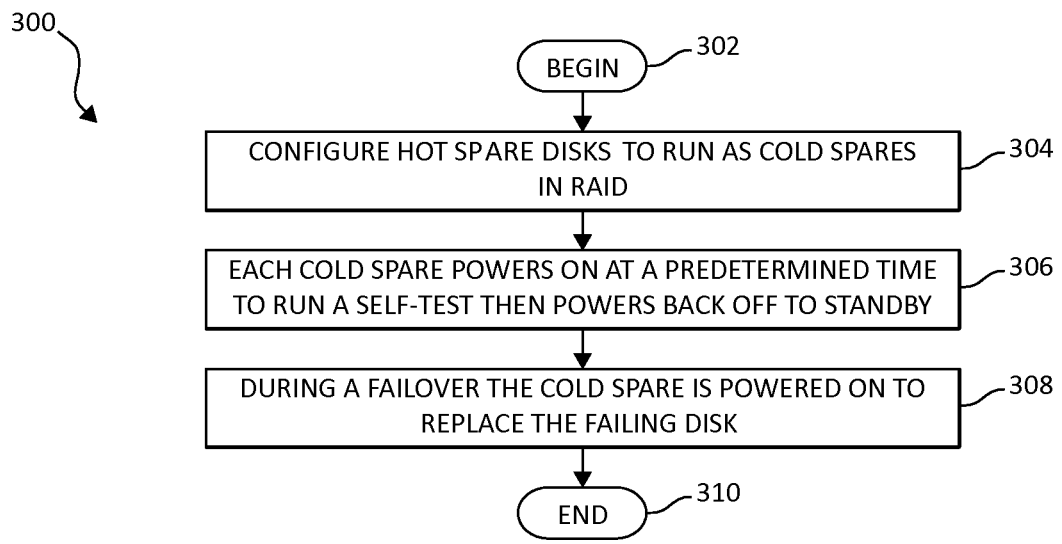
FIG. 3 illustrates a flow chart according to one aspect of the present invention.

FIG. 3 illustrates a flow chart of one example of one embodiment of the present invention 300. Beginning at 302, spare storage devices within a RAID system, which otherwise would be configured to run as hot spares, are configured to run as cold spares, or powered down in a standby mode within the RAID 304. Each cold spare is powered on at a predetermined time, or predetermined intervals, for device testing, after which the device is powered back down to a cold spare standby state 306. That is, each cold spare powers on at the predetermined time to run a self-test, then powers completely off to the powered down standby mode. During a failover in which a cold spare is required to replace a failing disk, the storage controller or controlling entity powers on and provisions the disk for replacement of the failing disk 308. The method ends at 310.

Configuring spare storage devices 230 to run as cold spares significantly increases efficiency in every aspect of the RAID system 200. Because the spare storage devices 230 are only powered on when necessary, the cost to operate decreases. Cost to operate also decreases in light of the fact that when a failed storage device 230 is replaced by a spare storage device 230 configured to run as a cold spare, it is effectively being replaced by a new device with minimal up time, rather than a device that has likely already reached its EOL without ever being beneficially used.

The controlling entity of the array, such as the RAID controller 220 has existing functionality of identifying spare storage devices 230 within the storage array 210, and their status. In one embodiment, the RAID controller 220 configures the powering up and powering down of the spare storage devices 230 configured to run as cold spares. Likewise, a controlling entity may control the predetermined intervals at which the cold spares are powered up, tested, and powered back down to standby. In one example, the intervals are listed on the existing matrix used by the controlling entity to identify the spare storage devices 230, in the form of a schedule matrix.

In one embodiment, a controlling entity, such as the RAID controller 220 may configure and test the disks as they are individually powered up to do so. In another example, the cold spare disks may be tested by a separate controlling entity, such as an administrator.

Although the present invention has been described above on the basis of the embodiment, the technical scope of the present invention is not limited to the above embodiment. It is apparent to those skilled in the art that various modifications or improvements can be added to the above embodiment.

It should be noted that execution orders of processes, such as operations, procedures, steps and stages in the devices, systems, programs and methods shown in the scope of claims, the description and the drawings, are not clearly specified particularly by use of expressions such as "before" and "prior to." Therefore, those processes are executable in any orders unless an output from a preceding process is used in a process subsequent thereto. Even if any operational flow in the scope of claims, in the description or in the drawings has been described by use of expressions such as "firstly," and "subsequently," for the sake of convenience, this does not necessarily mean that the operational flow has to be executed by an order indicated by these expressions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for configuring a redundant array of independent disks (RAID) array, by a processor device, comprising:
within a RAID array, configuring spare failover disks to run as cold spares, such that the cold spare disks stay in a powered-off standby mode, wherein each cold spare disk is powered on individually at predetermined intervals as defined in an existing schedule matrix used to identify the cold spare disks, tested, and powered back down to the standby mode thereby completely powering off each cold spare disk.

2. The method of claim 1, further including powering up and provisioning for replacement at least one of the cold spare disks during a disk failure or imminent disk failure.

3. The method of claim 2, wherein the powering up and powering down of the cold spare disks is controlled by a controlling entity.

4. The method of claim 3, wherein the controlling entity is a storage controller.

5. The method of claim 4, wherein the testing comprises running a self-test.

6. A system for configuring a redundant array of independent disks (RAID) array, comprising:
a processor device, wherein the processor device:
within a RAID array, configures spare failover disks to run as cold spares, such that the cold spare disks stay in a powered-off standby mode, wherein each cold spare disk is powered on individually at predetermined intervals as defined in an existing schedule matrix used to identify the cold spare disks, tested, and powered back down to the standby mode thereby completely powering off each cold spare disk.

7. The system of claim 6, wherein the processor device powers up and provisions for replacement at least one of the cold spare disks during a disk failure or imminent disk failure.

8. The system of claim 7, wherein the powering up and powering down of the cold spare disks is controlled by a controlling entity.

9. The system of claim 8, wherein the controlling entity is a storage controller.

10. The system of claim 9, wherein the testing comprises running a self-test.

11. A computer program product for configuring a redundant array of independent disks (RAID) array by a processor device, the computer program product comprising a non-transitory computer-readable storage medium having computer-readable program code portions stored therein, the computer-readable program code portions comprising:
a first executable portion that:
within a RAID array, configures spare failover disks to run as cold spares, such that the cold spare disks stay in a powered-off standby mode, wherein each cold spare disk is powered on individually at predetermined intervals as defined in an existing schedule matrix used to identify the cold spare disks, tested, and powered back down to the standby mode thereby completely powering off each cold spare disk.

12. The computer program product of claim 11, further including a second executable portion that powers up and provisions for replacement at least one of the cold spare disks during a disk failure or imminent disk failure.

13. The computer program product of claim 12, wherein the powering up and powering down of the cold spare disks is controlled by a controlling entity.

14. The computer program product of claim 13, wherein the controlling entity is a storage controller.

15. The computer program product of claim 14, wherein the testing comprises running a self-test.

* * * * *